(12) United States Patent
Hyodo et al.

(10) Patent No.: US 12,484,145 B2
(45) Date of Patent: Nov. 25, 2025

(54) STRETCHABLE ELECTRONIC DEVICE

(71) Applicant: Japan Display Inc., Tokyo (JP)

(72) Inventors: Yosuke Hyodo, Tokyo (JP); Takumi Sano, Tokyo (JP); Hiroumi Kinjo, Tokyo (JP); Masatomo Hishinuma, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 195 days.

(21) Appl. No.: 18/479,833

(22) Filed: Oct. 3, 2023

(65) Prior Publication Data

US 2024/0114616 A1   Apr. 4, 2024

(30) Foreign Application Priority Data

Oct. 4, 2022   (JP) ................................ 2022-160367

(51) Int. Cl.
*H05K 1/02*   (2006.01)
(52) U.S. Cl.
CPC . *H05K 1/0283* (2013.01); *H05K 2201/10151* (2013.01)
(58) Field of Classification Search
CPC ................... H05K 1/0283; H05K 2201/10151
USPC ....................................................... 174/254
See application file for complete search history.

(56) References Cited

U.S. PATENT DOCUMENTS

| | | | |
|---|---|---|---|
| 9,554,484 B2 * | 1/2017 | Rogers | H05K 1/189 |
| 10,964,769 B2 * | 3/2021 | Park | H10K 59/124 |
| 11,621,399 B2 | 4/2023 | Sano | |
| 12,328,994 B2 * | 6/2025 | Hishinuma | H10K 77/111 |
| 2004/0192082 A1 * | 9/2004 | Wagner | H05K 1/11 439/67 |
| 2013/0333094 A1 * | 12/2013 | Rogers | A61B 34/76 340/407.1 |
| 2016/0211471 A1 * | 7/2016 | Kwon | G06F 1/1652 |
| 2016/0358849 A1 * | 12/2016 | Jur | H10N 10/10 |
| 2021/0318715 A1 * | 10/2021 | Ha | H10K 59/121 |

FOREIGN PATENT DOCUMENTS

JP   2021-118273 A   8/2021

* cited by examiner

*Primary Examiner* — Timothy J Thompson
*Assistant Examiner* — Michael F Mcallister
(74) *Attorney, Agent, or Firm* — XSENSUS LLP

(57) ABSTRACT

According to an aspect, a stretchable device includes: a resin base member; and a strain gauge, a signal line, and an output line stacked on the resin base member. The resin base member includes: a plurality of bodies disposed separately from each other; and a plurality of hinges that couple the bodies adjacently disposed while meandering in an intersecting direction intersecting an imaginary line that couples the bodies adjacently disposed. The hinges include a first hinge and a second hinge that couple the bodies adjacently disposed. A meander length of the second hinge in the intersecting direction is longer than a meander length of the first hinge in the intersecting direction. The strain gauge is provided to the first hinge. The signal line and the output line are provided to the second hinge.

9 Claims, 16 Drawing Sheets

STRETCHABLE ELECTRONIC DEVICE

CROSS-REFERENCE TO RELATED APPLICATION

This application claims the benefit of priority from Japanese Patent Application No. 2022-160367 filed on Oct. 4, 2022, the entire contents of which are incorporated herein by reference.

BACKGROUND

1. Technical Field

What is disclosed herein relates to a stretchable device.

2. Description of the Related Art

Stretchable devices have excellent elasticity and flexibility. Such stretchable devices include a resin base member on which an array layer is stacked. The resin base member includes bodies arrayed in a matrix (row-column configuration) and hinges that couple the bodies to each other. The hinge described in Japanese Patent Application Laid-open Publication No. 2021-118273 includes a plurality of arcs and has a meandering shape. When a tensile load acts on the stretchable device, the arcs of the hinge deform to have a smaller curvature. In other words, the arcs deform to expand. As a result, the bodies are separated from each other, and the stretchable device extends.

In recent years, it has been considered to provide a strain gauge to the hinge and detect the amount of strain in the hinge to detect the load acting on the stretchable device. From this perspective, it is desired that the hinge have such a shape that makes strain likely to be generated in the strain gauge. Besides the strain gauge, a signal line that supplies an electric current to the strain gauge and an output line for detecting signals (amount of current) output from the strain gauge are stacked in the hinge. This configuration makes strain likely to be generated also in the signal line and the output line, whereby noise components are contained in the signals. As a result, the amount of strain in the hinge may not be accurately detected.

For the foregoing reasons, there is a need for a stretchable device that can reduce the amount of strain generated in the signal line and the output line.

SUMMARY

According to an aspect, a stretchable device includes: a resin base member; and a strain gauge, a signal line, and an output line stacked on the resin base member. The resin base member includes: a plurality of bodies disposed separately from each other; and a plurality of hinges that couple the bodies adjacently disposed while meandering in an intersecting direction intersecting an imaginary line that couples the bodies adjacently disposed. The hinges include a first hinge and a second hinge that couple the bodies adjacently disposed. A meander length of the second hinge in the intersecting direction is longer than a meander length of the first hinge in the intersecting direction. The strain gauge is provided to the first hinge. The signal line and the output line are provided to the second hinge.

DETAILED DESCRIPTION

Figure 1:
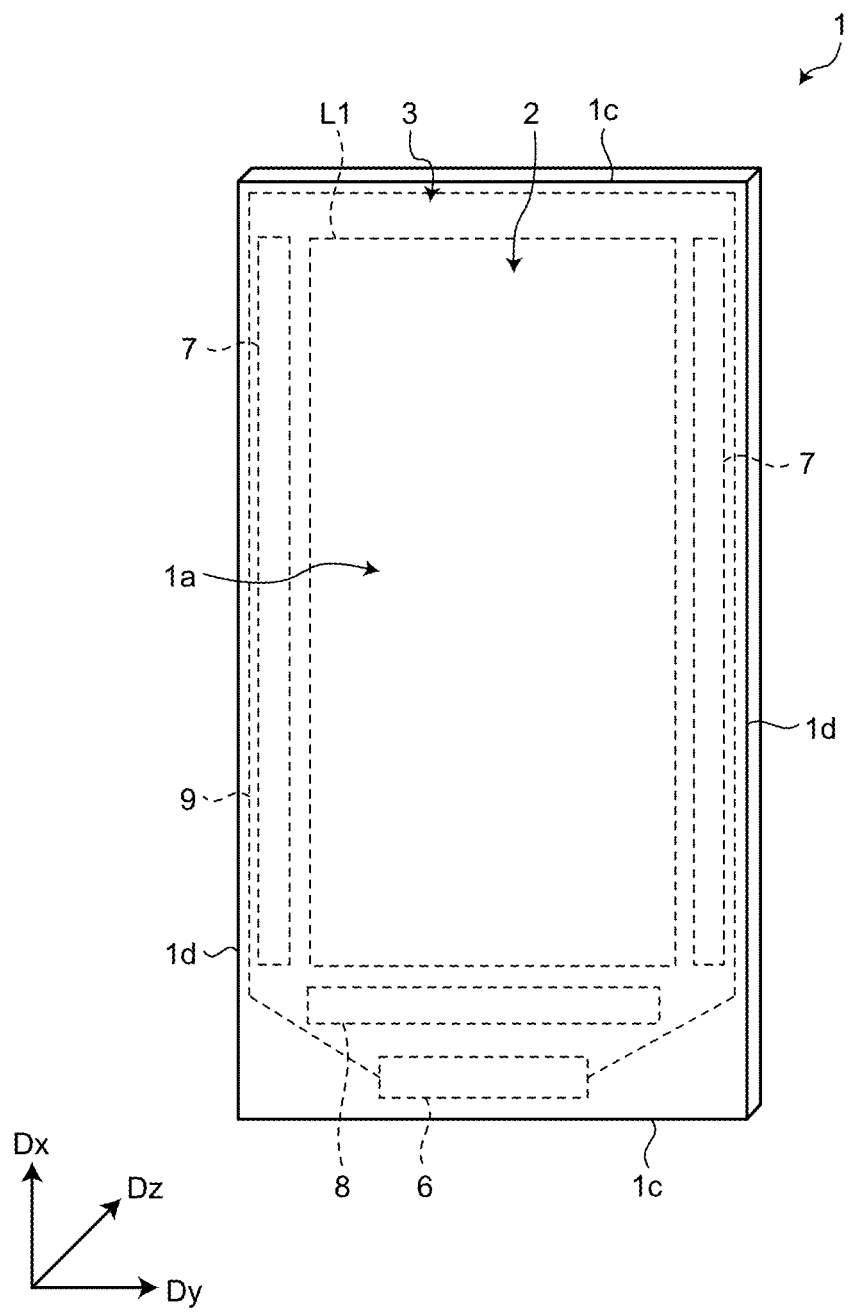
FIG. 1 is a schematic perspective view of a stretchable device according to a first embodiment.

Exemplary aspects (embodiments) to embody the present disclosure are described below in greater detail with reference to the accompanying drawings. The contents described in the embodiments below are not intended to limit the invention according to the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by the same reference numerals, and detailed explanation thereof may be appropriately omitted.

When the term "on" is used to describe an aspect where a first structure is disposed on or above a second structure in the present specification and the claims, it includes both of the following cases unless otherwise noted: a case where the first structure is disposed on and in contact with the second structure, and a case where the first structure is disposed above the second structure with still another structure interposed therebetween.

First Embodiment

FIG. 1 is a schematic perspective view of a stretchable device according to a first embodiment. As illustrated in FIG. 1, this stretchable device 1 has a flat plate shape. The stretchable device 1 has a surface 1a and a back surface 1b (not illustrated in FIG. 1, and refer to FIG. 2) facing opposite to each other. In the following description, the direction parallel to the surface 1a and the back surface 1b is referred to as a planar direction. A direction parallel to the planar direction is referred to as a first direction Dx. A direction parallel to the planar direction and intersecting the first direction Dx is referred to as a second direction Dy.

The surface 1a and the back surface 1b have a rectangular (quadrilateral) shape. The surface 1a has a pair of short sides 1c and a pair of long sides 1d. The first direction Dx according to the present embodiment is a direction parallel to the long side 1d. The second direction Dy is a direction parallel to the short side 1c. In other words, the first direction Dx and the second direction Dy according to the present embodiment are orthogonal to each other. The normal direction (stacking direction) of the surface 1a is referred to as a third direction Dz. The view of the stretchable device 1 in the third direction Dz may be referred to as plan view.

The stretchable device 1 is divided into a detection region 2 and a peripheral region 3 in plan view. The detection region 2 is a region in which the amount of strain of the stretchable device 1 can be detected. The peripheral region 3 is a frame-like region surrounding the outer periphery of the detection region 2. In FIG. 1, a boundary line L1 is drawn to make the boundary between the detection region 2 and the peripheral region 3 easy to understand.

Figure 2:
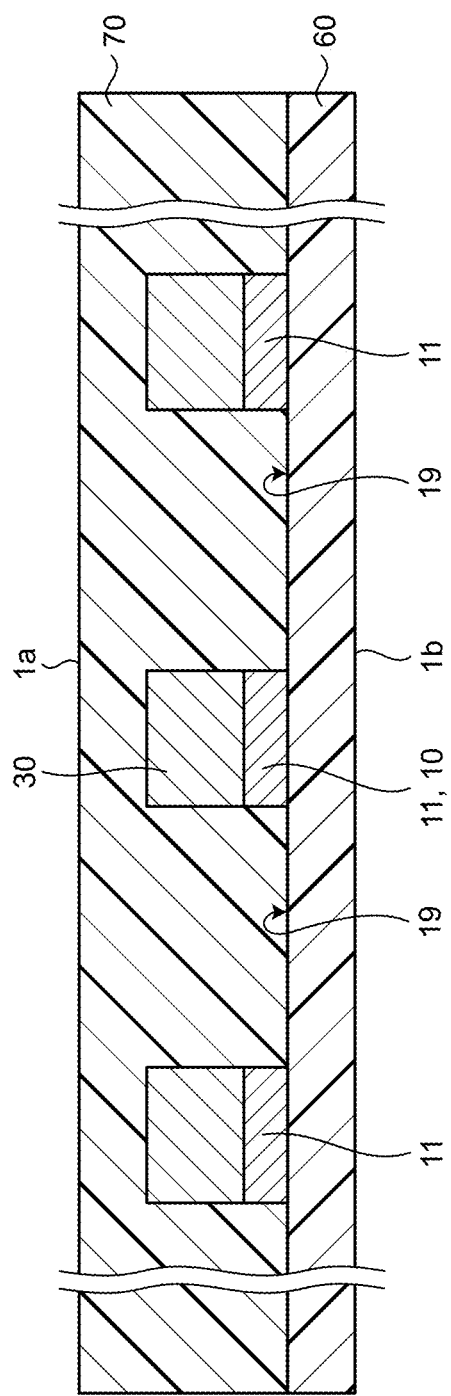
FIG. 2 is a schematic of a section of the stretchable device according to the first embodiment, and more specifically a sectional view along line II-II of FIG. 3.
Figure 3:
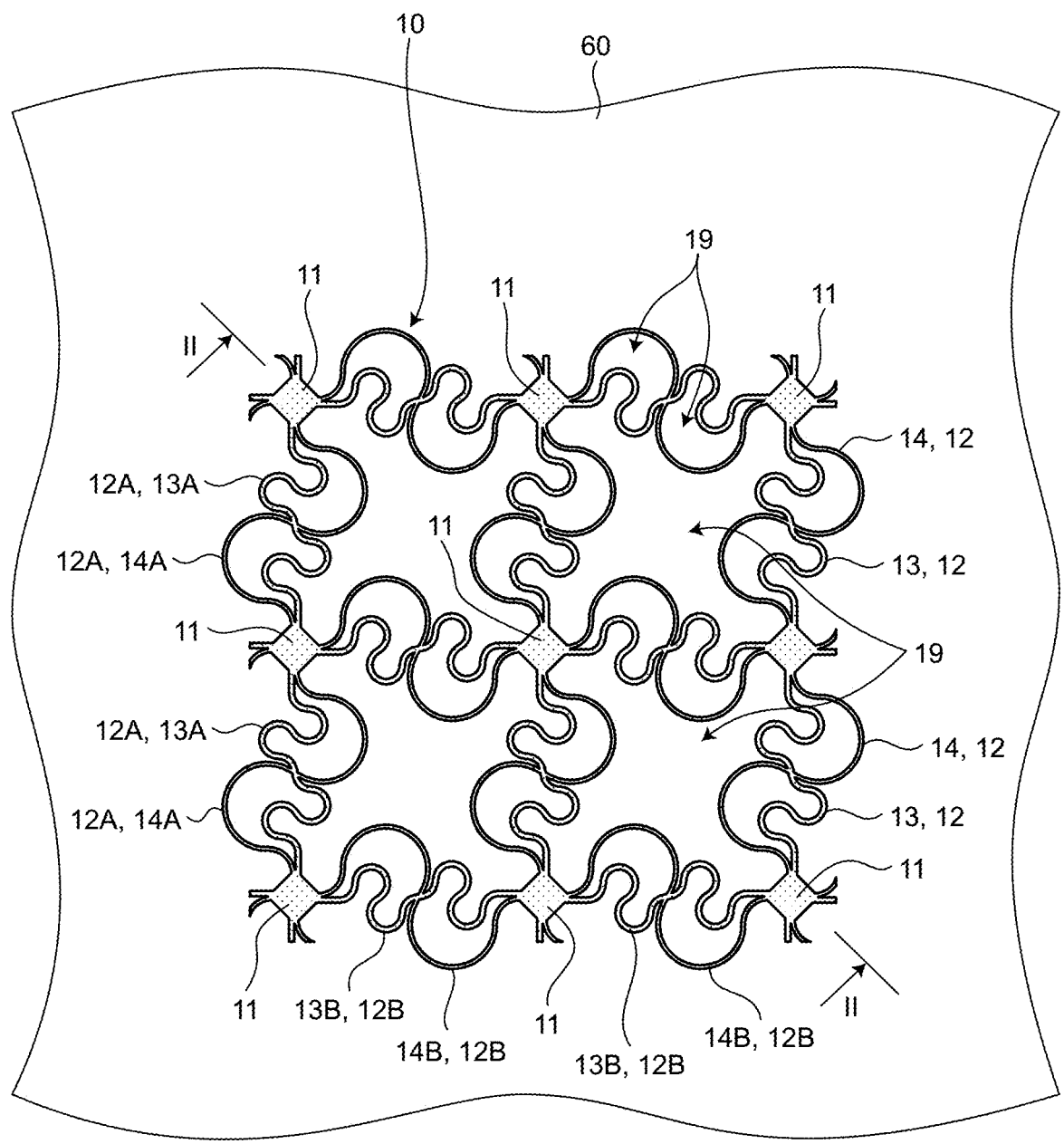
FIG. 3 is an enlarged view of part of a resin base member and a first resin plate of the stretchable device according to the first embodiment viewed from an array layer.

FIG. 2 is a schematic of a section of the stretchable device according to the first embodiment, and more specifically a sectional view along line II-II of FIG. 3. As illustrated in FIG. 2, the stretchable device 1 includes a first resin plate 60, a second resin plate 70, a resin base member 10, and an array layer 30. The first resin plate 60 has the back surface 1b. The second resin plate 70 has the surface 1a. The resin base member 10 and the array layer 30 are sandwiched between the first resin plate 60 and the second resin plate 70. The resin base member 10 and the array layer 30 are stacked in this order on the surface of the first resin plate 60 opposite to the back surface 1b.

The first resin plate 60 and the second resin plate 70 are made of resin material and have elasticity and flexibility. While examples of the resin material include, but are not limited to, acrylic resin, epoxy resin, urethane resin, etc., the present disclosure is not limited thereto. In the following description, the upper side or upward refers to one side in the third direction Dz and the side on which the second resin plate 70 is positioned when viewed from the first resin plate 60. The lower side or downward refers to the other side in the third direction Dz and the side on which the first resin plate 60 is positioned when viewed from the second resin plate 70.

FIG. 3 is an enlarged view of part of the resin base member and the first resin plate of the stretchable device according to the first embodiment viewed from the array layer. In FIG. 3, the resin base member 10 is hatched to make it easy to see the resin base member 10. The resin base member 10 is provided on the upper surface of the first resin plate 60. The resin base member 10 has elastic, flexible, and insulating properties. The resin base member 10 is made of resin material, such as polyimide.

The resin base member 10 includes bodies 11 and hinges 12. The bodies 11 are arrayed in a matrix (row-column configuration) in the first direction Dx and the second direction Dy. The hinges 12 couple adjacent bodies 11. The resin base member 10 has a plurality of hollow portions 19 between the bodies 11 and the hinges 12.

The array layer 30 is not stacked on the regions overlapping the hollow portions 19. As illustrated in FIG. 2, the hollow portion 19 is filled with the second resin plate 70. With this configuration, the stretchable device 1 has low rigidity in the area overlapping the hollow portion 19 and has elasticity and bendability (stretchability). When a load acts on the stretchable device 1, the hinges 12 deform, thereby suppressing deformation of the bodies 11. This mechanism reduces damage to functional elements (transistors 31 according to the present embodiment) stacked on the bodies 11. While the hollow portion 19 according to the present embodiment is filled with the second resin plate 70, it may be filled with the first resin plate 60 or with the first resin plate 60 and the second resin plate 70.

The body 11 according to the present embodiment has a rectangular shape in plan view. The four corners of the body 11 are disposed along the first direction Dx and the second direction Dy. The array layer 30 stacked on the body 11 includes the transistors 31 (refer to FIG. 8). The shape of the body 11 according to the present disclosure in plan view is not limited to a rectangle and may be circular or other polygonal shapes.

The hinges 12 include longitudinal hinges 12A and lateral hinges 12B. The longitudinal hinge 12A extends in the first direction Dx. The lateral hinge 12B extends in the second direction Dy. When the longitudinal hinge 12A is rotated by 90 degrees, it has the same shape as that of the lateral hinge 12B. Therefore, the following describes the longitudinal hinge 12A, and explanation of the lateral hinge 12B is omitted.

Figure 4:
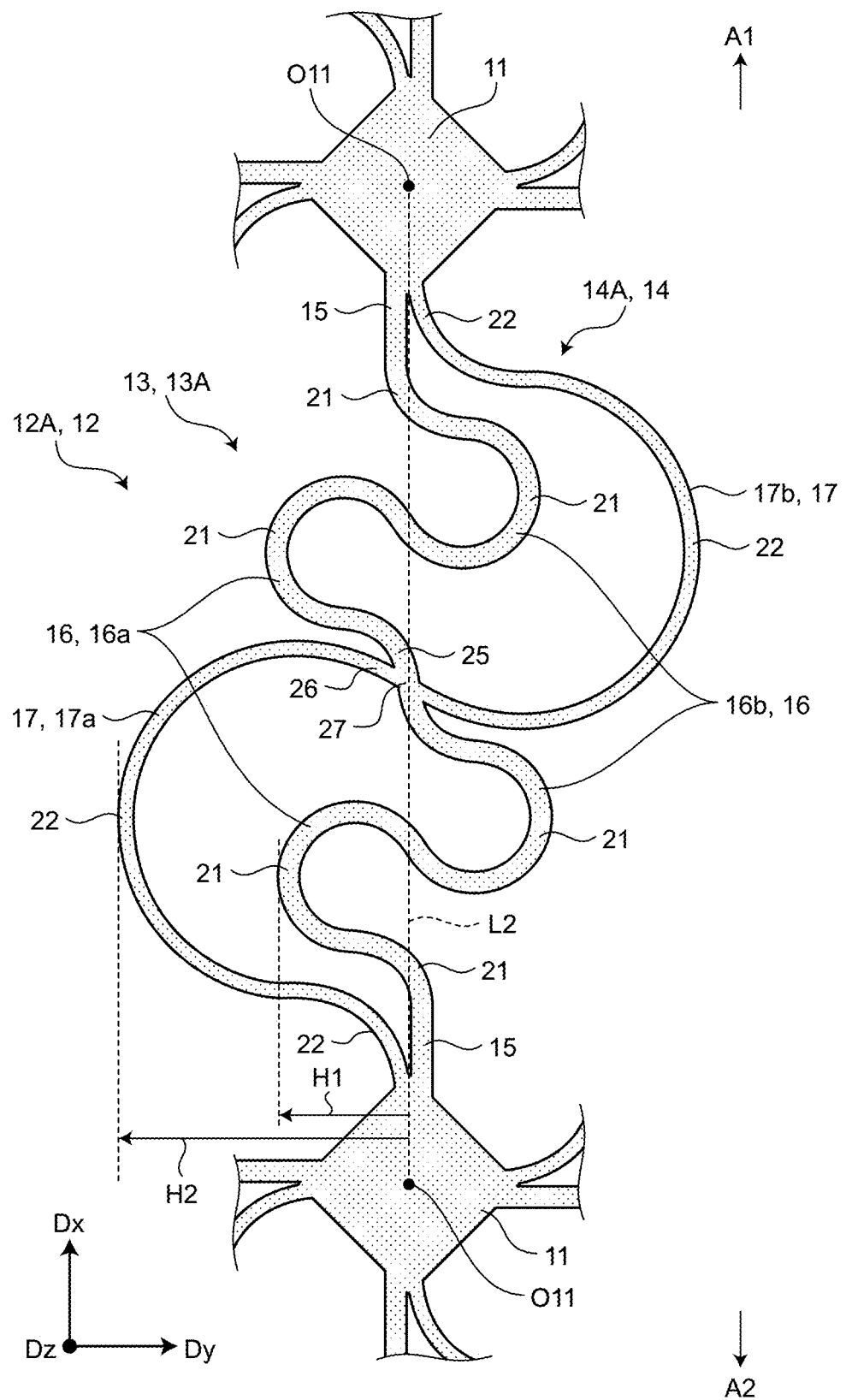
FIG. 4 is an enlarged view of two adjacent bodies and a first hinge and a second hinge disposed between the two bodies.

FIG. 4 is an enlarged view of two adjacent bodies and a first hinge and a second hinge disposed between the two bodies. As illustrated in FIG. 4, the longitudinal hinge 12A (hinge 12) includes a first longitudinal hinge 13A (first hinge 13) and a second longitudinal hinge 14A (second hinge 14) extending separately between the adjacent bodies 11. The lateral hinge 12B (hinge 12) includes a first lateral hinge 13B (first hinge 13) and a second lateral hinge 14B (second hinge 14) (refer to FIG. 3).

As illustrated in FIG. 4, the first longitudinal hinge 13A includes two bases 15 and four small-diameter arcs 16. The two bases 15 are disposed at both ends of the first longitudinal hinge 13A in the longitudinal direction. The four small-diameter arcs 16 are disposed between the two bases 15. The base 15 linearly extends from the body 11 in the first direction Dx. The small-diameter arc 16 has an arc shape in plan view. Two small-diameter arcs 16a of the four small-diameter arcs 16 are disposed protruding toward one side in the second direction Dy. The other two small-diameter arcs 16b of the four small-diameter arcs 16 are disposed protruding toward the other side in the second direction Dy. The small-diameter arcs 16a and 16b are alternately disposed in the first direction Dx. Therefore, the first longitudinal hinge 13A extends in the first direction Dx while meandering between the two bodies 11.

The second longitudinal hinge 14A includes two large-diameter arcs 17 having an arc shape in plan view. One large-diameter arc 17a of the two large-diameter arcs 17 is disposed protruding toward one side in the second direction Dy. The other large-diameter arc 17b of the two large-diameter arcs 17 is disposed protruding toward the other side in the second direction Dy. First ends of the large-diameter arcs 17a and 17b in the longitudinal direction are coupled to the bodies 11. Second ends of the large-diameter arcs 17a and 17b in the longitudinal direction are coupled to each other. Therefore, the second hinge 14 extends in the first direction Dx while meandering between the two bodies 11.

The large-diameter arc 17 has a smaller curvature than the small-diameter arc 16. In other words, the large-diameter arc 17 has a larger radius of curvature than the small-diameter arc 16. Therefore, the length of the large-diameter arc 17 in the first direction Dx is longer than that of the small-diameter arc 16 in the first direction Dx. Thus, the number of arcs (large-diameter arcs 17) arranged in the second longitudinal hinge 14A is smaller than that of arcs (small-diameter arcs 16) arranged in the first longitudinal hinge 13A. The number of small-diameter arcs 16 arranged in the first hinge 13 and the number of large-diameter arcs 17 arranged in the second hinge 14 according to the present disclosure are not limited to those in the example according to the present embodiment.

The meander length of the first longitudinal hinge 13A in the second direction Dy is H1. The meander length of the second longitudinal hinge 14A in the second direction Dy is H2. The meander length is the length (distance) extending from an imaginary line L2 coupling centers O11 of the respective bodies 11 to the direction intersecting the imaginary line L2. In other words, the meander length is the amount of protrusion of the arc (the small-diameter arc 16 and the large-diameter arc 17) from the imaginary line L2. As described above, the large-diameter arc 17 has a smaller curvature than the small-diameter arc 16.

Therefore, the meander length H2 of the second longitudinal hinge 14A is longer than the meander length H1 of the first longitudinal hinge 13A.

The following describes strain generated in the first longitudinal hinge 13A and the second longitudinal hinge 14A when the stretchable device 1 expands and contracts.

As illustrated in FIG. 4, in the first longitudinal hinge 13A, the coupling portion between the base 15 and the small-diameter arc 16 is bent at 90 degrees to form a first bend 21. The centers of the four small-diameter arcs 16 (16a and 16b) in the longitudinal direction are bent at 180 degrees. Thus, the centers of the small-diameter arcs 16 (16a and 16b) in the longitudinal direction form the first bends 21.

In the second longitudinal hinge 14A, the coupling portion between the body 11 and the large-diameter arc 17 is bent at 90 degrees to form a second bend 22. The centers of the two large-diameter arcs 17 (17a and 17b) in the longitudinal direction are bent at 180 degrees. Thus, the centers of the large-diameter arcs 17 (17a and 17b) in the longitudinal direction form the second bends 22.

When a tensile load in the first direction Dx (refer to arrows A1 and A2 in FIG. 4) acts on the first longitudinal hinge 13A, the bending angle of each first bend 21 increases, and the length of the first hinge 13 in the first direction Dx increases. Therefore, when the first longitudinal hinge 13A is extended, deformation is concentrated in the first bends 21, whereby the amount of strain in the first bends 21 is large.

Similarly, when a tensile load in the first direction Dx (refer to arrows A1 and A2 in FIG. 4) acts on the second longitudinal hinge 14A, the bending angle of each second bend 22 increases, and the length of the second longitudinal hinge 14A in the first direction Dx increases. Therefore, when the second longitudinal hinge 14A is extended, deformation is concentrated in the second bends 22, whereby the amount of strain in the second bends 22 is large.

The meander length H2 of the second longitudinal hinge 14A is longer than the meander length H1 of the first longitudinal hinge 13A. Therefore, the bending angle of the first bend 21 is larger than that of the second bend 22. As a result, the amount of strain generated in the first bend 21 is larger than that generated in the second bend 22. Consequently, the amount of strain generated in the second longitudinal hinge 14A is smaller than that generated in the first longitudinal hinge 13A.

The first longitudinal hinge 13A also has a first coupling portion 25 forming a gentle curve at the center in the longitudinal direction. This first coupling portion 25 is positioned between the small-diameter arc 16a and the small-diameter arc 16b. When the first longitudinal hinge 13A is extended, the amount of deformation (strain) generated in the first coupling portion 25 is extremely small.

Similarly, the second longitudinal hinge 14A also has a second coupling portion 26 forming a gentle curve at the center in the longitudinal direction. The second coupling portion 26 is positioned between the large-diameter arc 17a and the large-diameter arc 17b. When the second longitudinal hinge 14A is extended, the amount of deformation (strain) generated in the second coupling portion 26 is extremely small.

The first coupling portion 25 and the second coupling portion 26 intersect and are integrated. In other words, the first longitudinal hinge 13A and the second longitudinal hinge 14A intersect in the middle of the longitudinal direction. If the amount of deformation (strain) of one of the coupling portions is large, the amount of deformation (strain) of the other coupling portion is also large. For this reason, in the present embodiment, the portions (the first coupling portion 25 and the second coupling portion 26) each having a small amount of deformation (strain) are coupled to each other. The part where the first coupling portion 25 and the second coupling portion 26 intersect is hereinafter referred to as an intersection 27.

Figure 5:
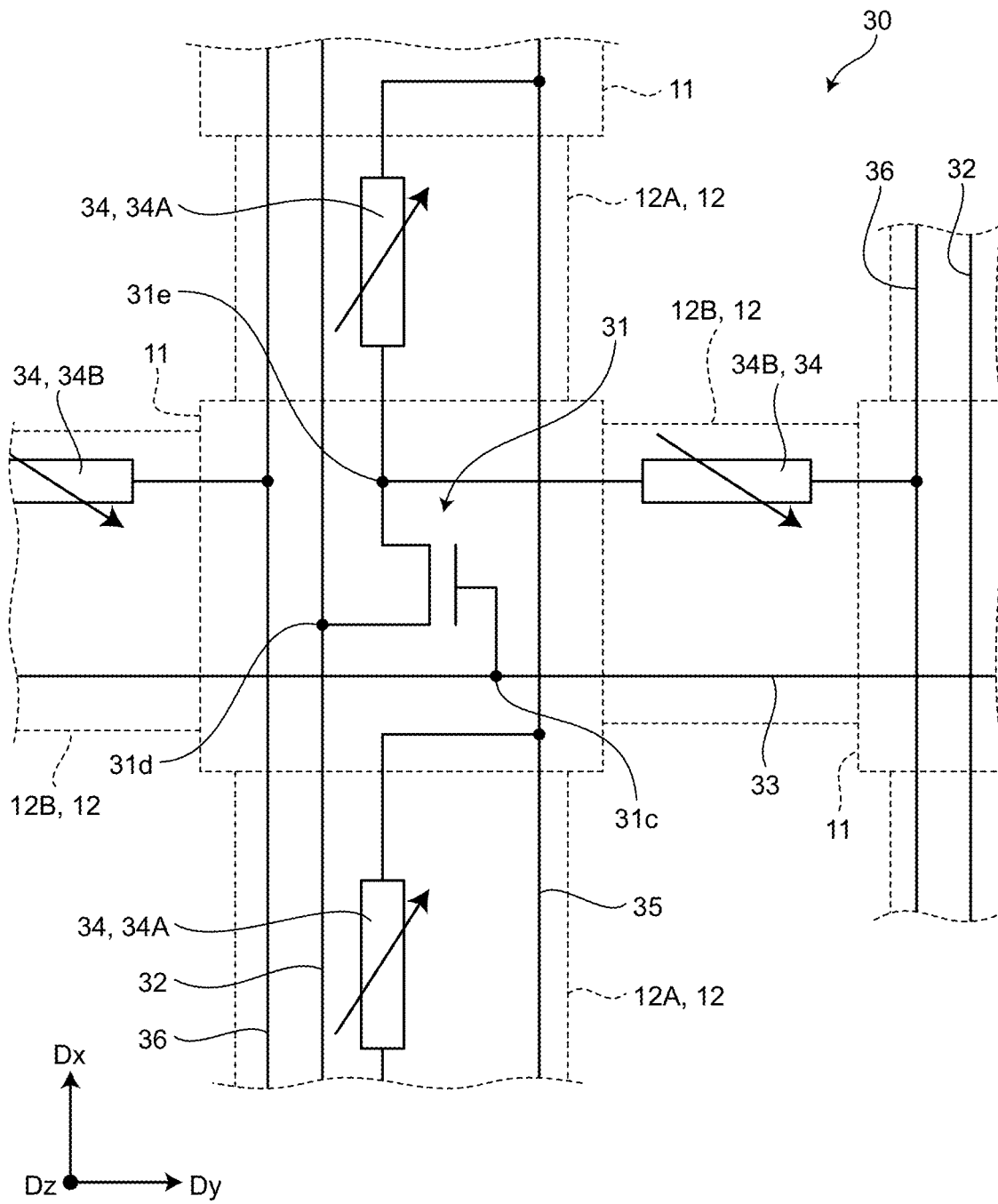
FIG. 5 is a diagram of the circuit configuration of an array layer stacked on a resin base member according to the first embodiment.
Figure 6:
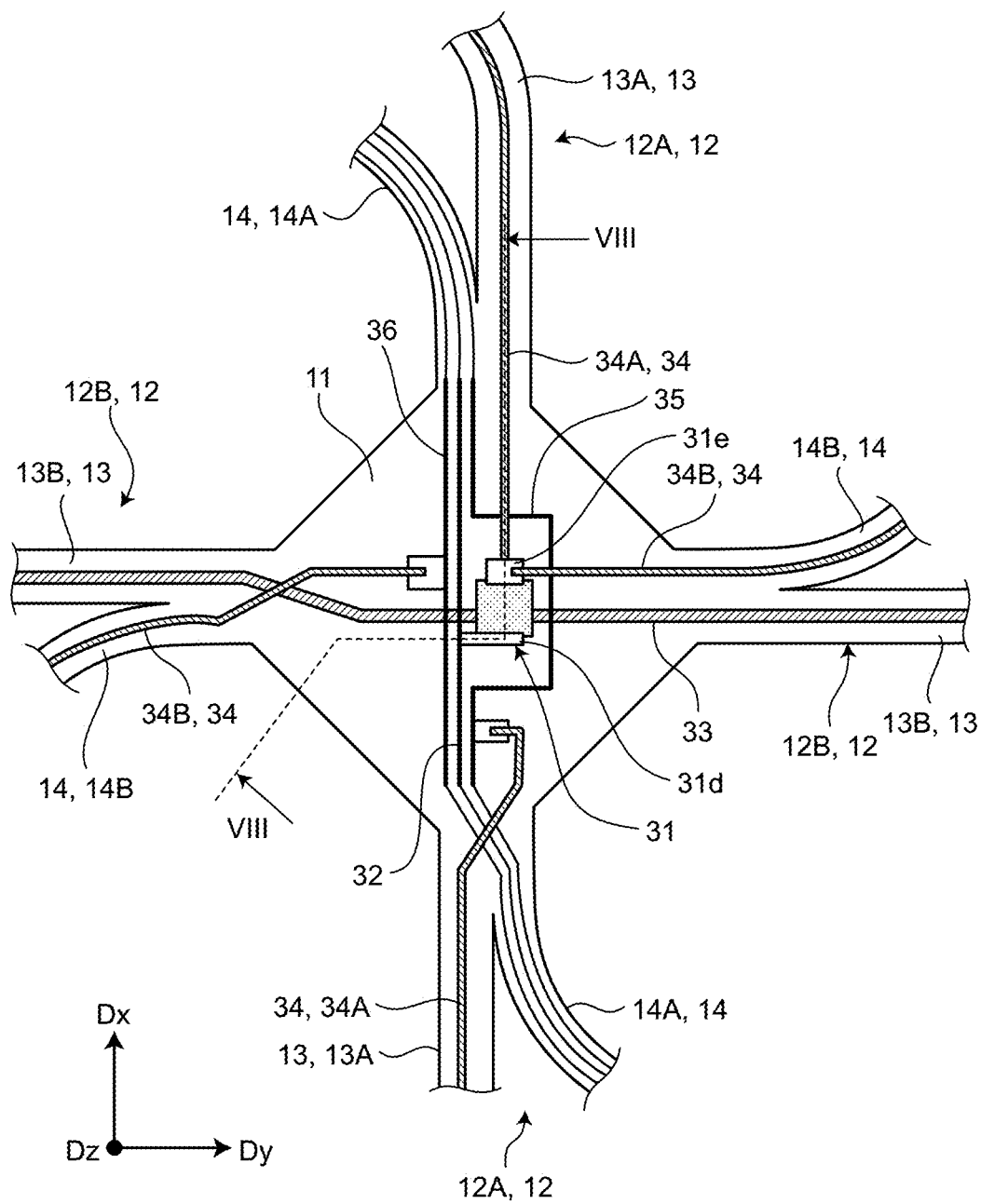
FIG. 6 is a plan view of a part of the array layer according to the first embodiment stacked on the body viewed from a second resin base member.

FIG. 5 is a diagram of the circuit configuration of the array layer stacked on the resin base member according to the first embodiment. FIG. 6 is a plan view of a part of the array layer according to the first embodiment stacked on the body viewed from a second resin base member.

The following describes the array layer 30. The array layer 30 includes various components for detecting the amount of strain of the hinge 12. Specifically, the array layer 30 includes a coupler 6 (refer to FIG. 1), a gate line drive circuit 7 (refer to FIG. 1), an output line selection circuit 8 (refer to FIG. 1), current wiring 9 (refer to FIG. 1), the transistors 31 (refer to FIG. 5), a plurality of signal lines 32 extending in the first direction Dx (refer to FIG. 5), a plurality of gate lines 33 extending in the second direction Dy (refer to FIG. 5), a plurality of strain gauges 34 (refer to FIG. 5), a plurality of first output lines 35 extending in the first direction Dx (refer to FIG. 5), and a plurality of second output lines 36 extending in the first direction Dx (refer to FIG. 5).

As illustrated in FIG. 1, the coupler 6, the gate line drive circuit 7, the output line selection circuit 8, and the current wiring 9 are disposed overlapping the peripheral region 3. The coupler 6 is coupled to a drive integrated circuit (IC) disposed outside the stretchable device 1. The drive IC may be mounted as a chip on film (COF) on a flexible printed circuit board or a rigid board, which is not illustrated, and coupled to the coupler 6. Alternatively, the drive IC may be mounted as a chip on glass (COG) in the peripheral region 3 of the first resin plate 60.

The gate line drive circuit 7 is a circuit that drives the gate lines 33 based on various control signals supplied from the drive IC. The gate line drive circuit 7 sequentially or simultaneously selects the gate lines 33 and supplies gate drive signals to the selected gate line 33. The output line selection circuit 8 is a switch circuit that sequentially or simultaneously selects the first output lines 35 and the second output lines 36. The output line selection circuit 8 is a multiplexer, for example. The output line selection circuit 8 couples the selected first output line 35 or the selected second output line 36 to the drive IC based on selection signals supplied from the drive IC. The current wiring 9 is wiring for supplying a predetermined amount of electric current to the signal lines 32 and extends along the peripheral region 3. The current wiring 9 is coupled to the drive IC via the coupler 6, and a predetermined amount of electric current flows through it.

The transistors 31, the signal lines 32, the gate lines 33, the strain gauges 34, the first output lines 35, and the second output lines 36 are stacked on the resin base member 10 (refer to FIG. 3) and are disposed in the detection region 2 (refer to FIG. 1).

As illustrated in FIGS. 5 and 6, the signal line 32 is disposed over a plurality of longitudinal hinges 12A and a plurality of bodies 11. As a result, the signal line 32 continuously extends from one end to the other of the detection region 2 in the first direction Dx. The signal lines 32 are arrayed in the second direction Dy. One end of each signal line 32 is coupled to the current wiring 9 (refer to FIG. 1).

Each gate line 33 is disposed over the lateral hinges 12B and the bodies 11. As a result, the gate line 33 continuously extends from one end to the other of the detection region 2 in the second direction Dy. The gate lines 33 are arrayed in the first direction Dx. One end of each gate line 33 is coupled to the gate line drive circuit 7 (refer to FIG. 1).

The first output line 35 and the second output line 36 are disposed over the longitudinal hinges 12A and the bodies 11. As a result, the first output line 35 and the second output line 36 continuously extend from one end to the other of the detection region 2 in the first direction Dx. The first output lines 35 and the second output lines 36 are arrayed in the second direction Dy. One end of each of the first output lines 35 and the second output lines 36 is coupled to the output line selection circuit 8.

The transistors 31 are stacked on the respective bodies 11 of the resin base member 10. Therefore, the transistors 31 are arrayed in a matrix (row-column configuration) in the detection region 2. A gate electrode 31c (refer to FIG. 5) of the transistor 31 is coupled to the gate line 33. A drain electrode 31d of the transistor 31 is coupled to the signal line 32.

The strain gauge 34 is wiring for measuring the amount of strain. The strain gauges 34 are stacked on the respective hinges 12. Thus, the strain gauges 34 include longitudinal strain gauges 34A extending in the first direction Dx and lateral strain gauges 34B extending in the second direction Dy.

The longitudinal strain gauge 34A is stacked on the longitudinal hinge 12A. One end of the longitudinal strain gauge 34A extends to one of the two bodies 11 that sandwich the longitudinal hinge 12A and is coupled to a source electrode 31e of the transistor 31. The other end of the longitudinal strain gauge 34A extends to the other of the two bodies 11 that sandwich the longitudinal hinge 12A and is coupled to the first output line 35.

The lateral strain gauge 34B is stacked on the lateral hinge 12B. One end of the lateral strain gauge 34B extends to one of the two bodies 11 that sandwich the lateral hinge 12B and is connected to the source electrode 31e of the transistor 31. The other end of the lateral strain gauge 34B extends to the other of the two bodies 11 that sandwich the lateral hinge 12B and is coupled to the second output line 36.

With the configuration described above, when the gate line 33 is selected and scanned by the gate line drive circuit 7, the transistor 31 is turned ON. As a result, the signal line 32 and one end of the strain gauge 34 are electrically coupled, and an electric current of the current wiring 9 flows to the strain gauge 34. Subsequently, the electric current (electrical signal) flows to the first output line 35 and the second output line 36 coupled to the other end of the strain gauge 34. The first output line 35 or the second output line 36 selected by the output line selection circuit 8 is coupled to the drive IC, and the electric current (electrical signal) is transmitted to the drive IC.

Figure 7:
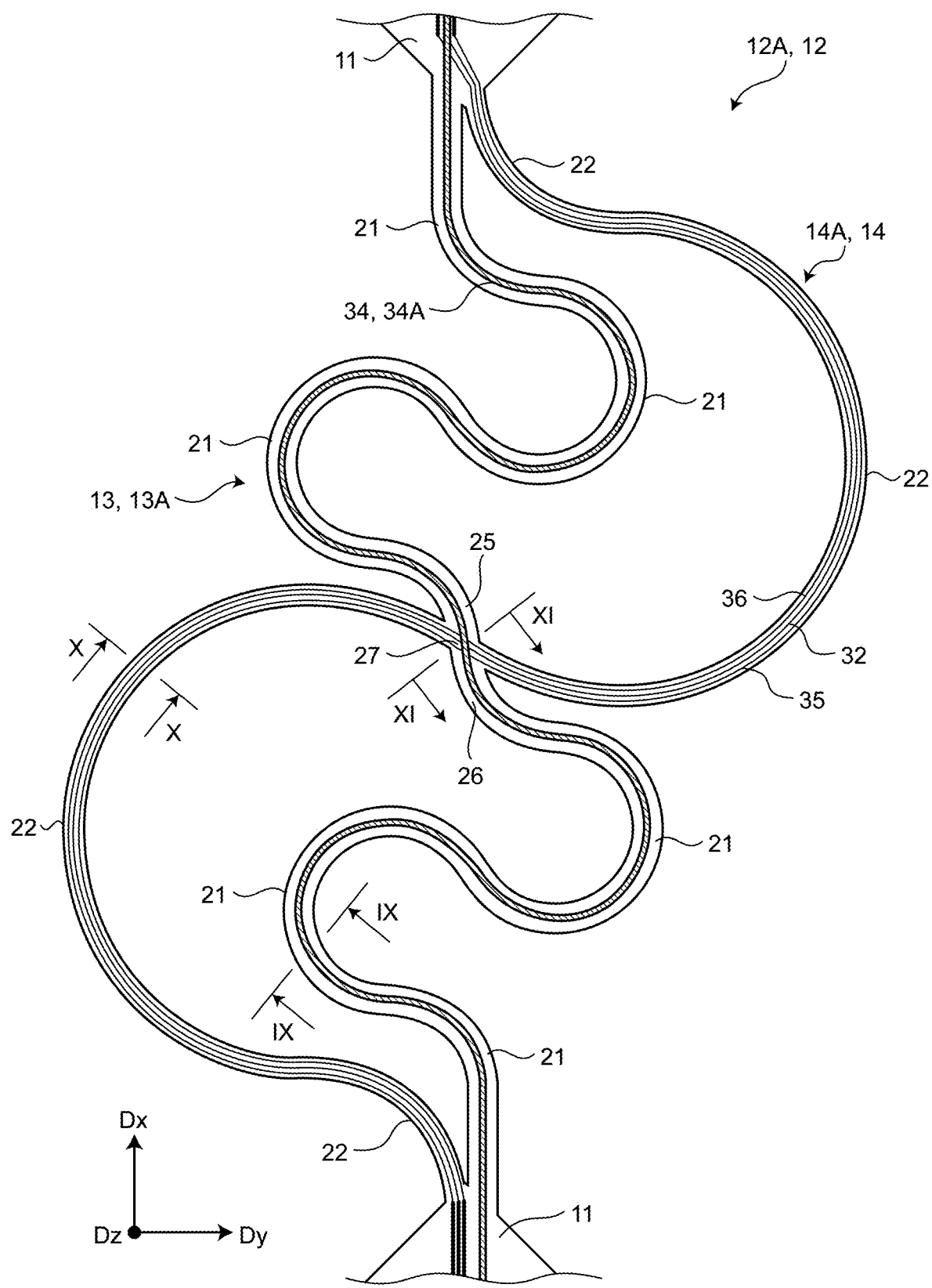
FIG. 7 is a plan view of a part of the array layer according to the first embodiment stacked on the hinge viewed from the second resin base member.

FIG. 7 is a plan view of a part of the array layer according to the first embodiment stacked on the hinge viewed from the second resin base member. The following describes the wiring stacked on the longitudinal hinge 12A and the lateral hinge 12B in greater detail.

As illustrated in FIG. 7, the longitudinal strain gauge 34A is stacked on the first longitudinal hinge 13A. By contrast, the signal line 32, the first output line 35, and the second output line 36 are stacked on the second longitudinal hinge 14A. As described above, the amount of strain generated in the second bend 22 of the second longitudinal hinge 14A when the longitudinal hinge 12A expands and contracts is smaller than that generated in the first bend 21 of the first longitudinal hinge 13A. Therefore, the amount of strain generated in the signal line 32, the first output line 35, and the second output line 36 is small.

The lateral strain gauge 34B is stacked on the first lateral hinge 13B of the lateral hinge 12B, which is not specifically illustrated. The gate line 33 is stacked on the second lateral hinge 14B of the lateral hinge 12B. Therefore, the amount of strain generated in the gate line 33 is also small.

The following describes the sectional structure of the array layer 30. The sectional structure of the array layer 30 is described separately for the part stacked on the body 11 and the part stacked on the hinge 12.

Figure 8:
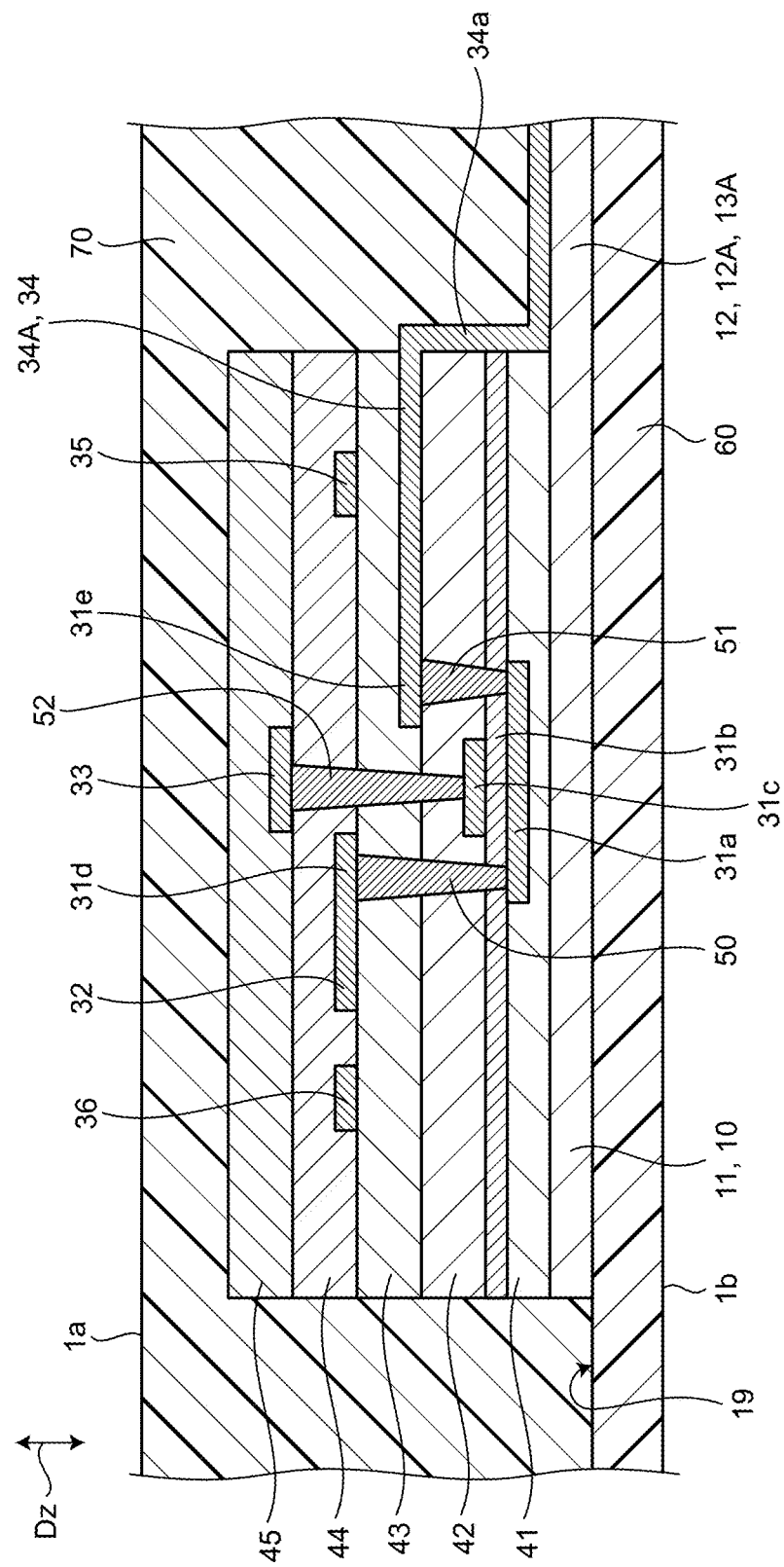
FIG. 8 is a sectional view seen in the arrow direction along line VIII-VIII of FIG. 6.

FIG. 8 is a sectional view seen in the arrow direction along line VIII-VIII of FIG. 6. As illustrated in FIG. 8, a plurality of insulating layers are stacked on the part of the array layer 30 stacked on the body 11. Specifically, a first insulating layer 41, a second insulating layer 42, a third insulating layer 43, a fourth insulating layer 44, and a fifth insulating layer 45 are stacked on the body 11. The first insulating layer 41, the second insulating layer 42, the third insulating layer 43, the fourth insulating layer 44, and the fifth insulating layer 45 are silicon oxide films, for example, and cover the transistor 31 and various kinds of wiring (the signal line 32, the gate line 33, the strain gauge 34, the first output line 35, and the second output line 36). In the configuration according to the present embodiment, a gate insulating film 31b of the transistor 31 is interposed between the first insulating layer 41 and the second insulating layer 42.

The strain gauge 34 is stacked on the second insulating layer 42. The signal line 32 is stacked on the third insulating layer 43. The gate line 33 is stacked on the fourth insulating layer 44. The transistor 31 includes a semiconductor layer 31a, the gate insulating film 31b, the gate electrode 31c, the drain electrode 31d, and the source electrode 31e. The semiconductor layer 31a is coupled to the drain electrode 31d and the source electrode 31e via contact layers 50 and 51. The gate electrode 31c is coupled to the gate line 33 via a contact layer 52. The drain electrode 31d is disposed in the same layer as that of the signal line 32 and is coupled to the signal line 32. The source electrode 31e is disposed in the same layer as that of the strain gauge 34 and is coupled to the strain gauge 34.

Figure 9:
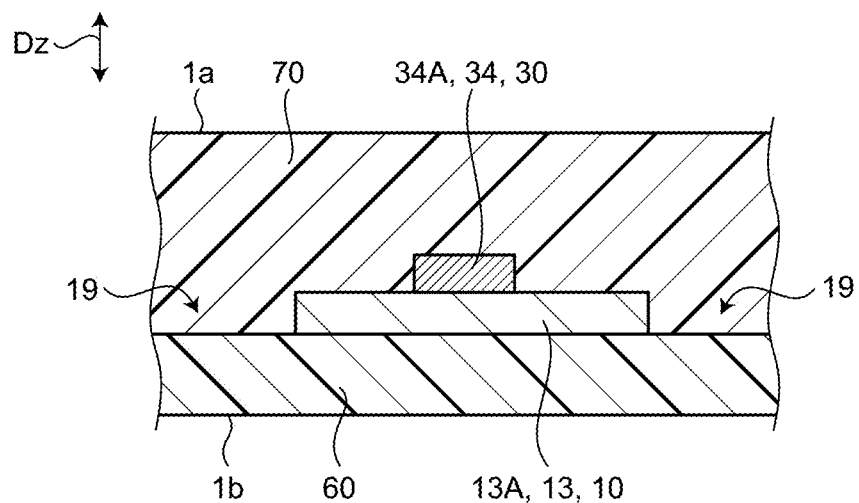
FIG. 9 is a sectional view seen in the arrow direction along line IX-IX of FIG. 7.
Figure 10:
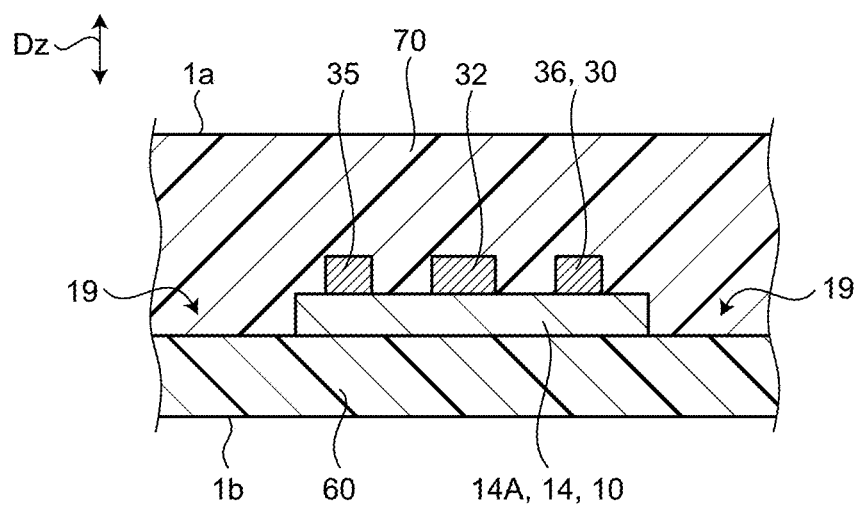
FIG. 10 is a sectional view seen in the arrow direction along line X-X of FIG. 7.
Figure 11:
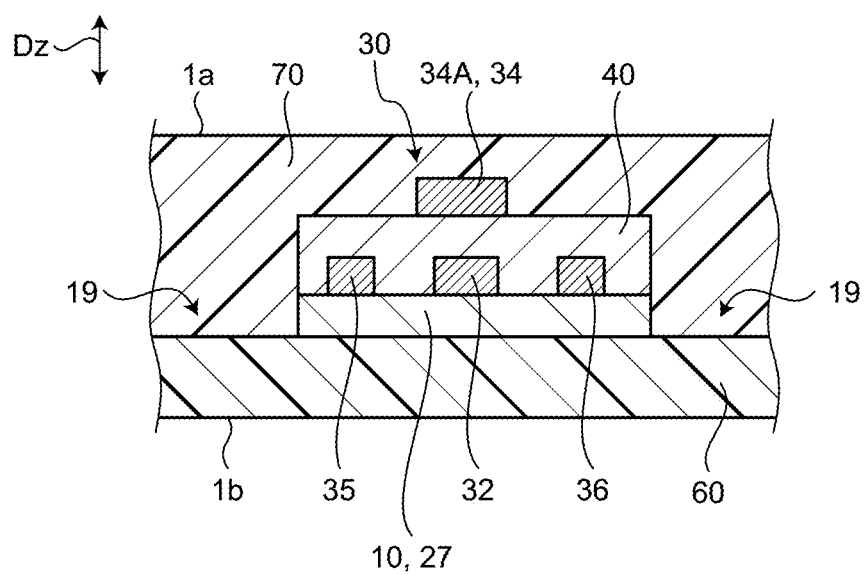
FIG. 11 is a sectional view seen in the arrow direction along line XI-XI of FIG. 7.

FIG. 9 is a sectional view seen in the arrow direction along line IX-IX of FIG. 7. FIG. 10 is a sectional view seen in the arrow direction along line X-X of FIG. 7. FIG. 11 is a sectional view seen in the arrow direction along line XI-XI of FIG. 7. The part of the array layer 30 stacked on the first longitudinal hinge 13A is provided with the longitudinal strain gauge 34A. In other words, the longitudinal strain gauge 34A is stacked on the first longitudinal hinge 13A. The second resin plate 70 is provided to cover the first longitudinal hinge 13A and the longitudinal strain gauge 34A. As illustrated in FIG. 8, a coupling portion 34a is provided between the part of the strain gauge 34 stacked on the second insulating layer 42 and the part stacked on the first longitudinal hinge 13A. The coupling portion 34a extends in the third direction Dz along the side surface of the second insulating layer 42 and the side surface of the first insulating layer 41.

As illustrated in FIG. 10, the part of the array layer 30 stacked on the second longitudinal hinge 14A is provided with the signal line 32, the first output line 35, and the second output line 36. The first output line 35 and the second output line 36 sandwich the signal line 32. In other words, the signal line 32, the first output line 35, and the second output line 36 are stacked on the second longitudinal hinge 14A. The second resin plate 70 is provided to cover the second longitudinal hinge 14A, the signal line 32, the first output line 35, and the second output line 36.

As illustrated in FIG. 11, however, the part of the array layer 30 stacked on the intersection 27 is provided with the signal lines 32, the first output line 35, the second output line 36, an insulating layer 40, and the longitudinal strain gauge 34A. In other words, the signal line 32, the first output line 35, and the second output line 36 are stacked on the intersection 27. The insulating layer 40 is stacked to cover the intersection 27, the signal line 32, the first output line 35, and the second output line 36. The longitudinal strain gauge 34A is provided on the insulating layer 40. Therefore, the insulating layer 40 is stacked only on the intersection 27 where the amount of deformation is extremely small in the longitudinal hinge 12A. This configuration reduces occurrence of damage of the insulating layer 40 that would be caused by deformation of the longitudinal hinge 12A.

The part of the array layer 30 stacked on the first lateral hinge 13B has the same configuration as that stacked on the first longitudinal hinge 13A. Specifically, only the lateral strain gauge 34B is stacked on the first lateral hinge 13B, which is not specifically illustrated. Only the gate line 33 is stacked on the second lateral hinge 14B. At the intersection of the first lateral hinge 13B and the second lateral hinge 14B, the gate line 33, an insulating layer, which is not illustrated, and the lateral strain gauge 34B are stacked in this order and are covered by the second resin plate 70.

As described above, the stretchable device 1 according to the first embodiment has a small amount of strain generated in the signal line 32, the first output line 35, and the second output line 36. Therefore, the noise component contained in the electric current (electrical signal) transmitted from the first output line 35 to the drive IC is also small, and the stretchable device 1 can accurately detect the amount of strain in the longitudinal hinge 12A.

Next, other embodiments are described. The following describes the other embodiments focusing on the differences from the first embodiment.

Second Embodiment

Figure 12:
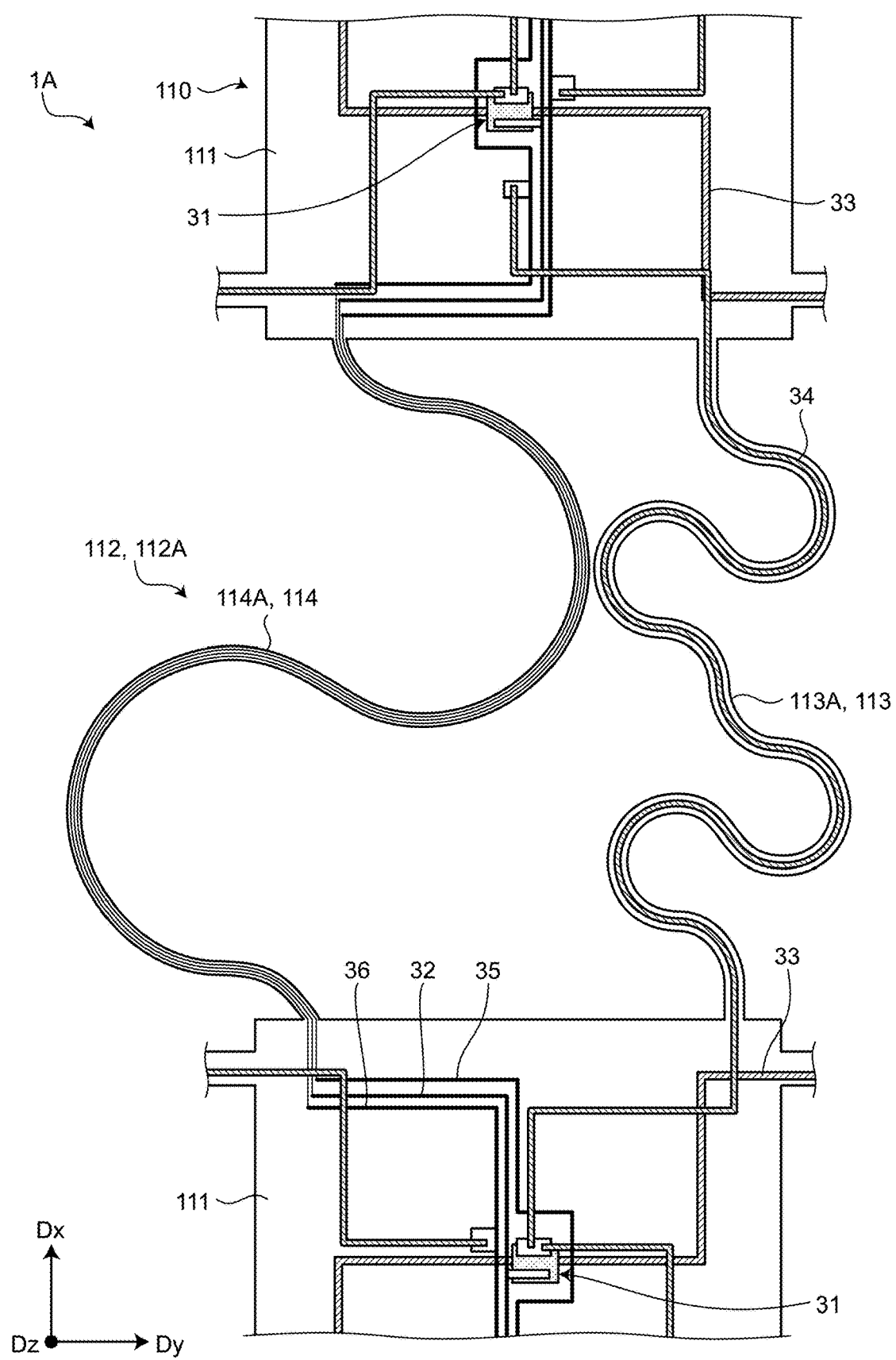
FIG. 12 is a view of a longitudinal hinge according to a second embodiment viewed from a second resin plate.

FIG. 12 is a view of the longitudinal hinge according to a second embodiment viewed from the second resin plate. A stretchable device 1A according to the second embodiment is different from the stretchable device 1 according to the first embodiment in that it includes a resin base member 110 instead of the resin base member 10. The resin base member 110 includes a plurality of bodies 111 and a plurality of hinges 112. The body 111 is the same as the body 11 according to the first embodiment in that it has a rectangular shape when viewed in the third direction Dz. The body 111, however, is different from the body 11 according to the first embodiment in that the four sides face the first direction Dx and the second direction Dy.

The hinges 112 include a first hinge 113 and a second hinge 114. The hinges 112 include longitudinal hinges 112A and lateral hinges (not illustrated). When the longitudinal hinge 112A is rotated by 90 degrees, it has the same shape as that of the lateral hinge (not illustrated). The following describes the longitudinal hinge 112A, and explanation of the lateral hinge (not illustrated) is omitted.

The longitudinal hinge 112A includes a first longitudinal hinge 113A and a second longitudinal hinge 114A. The first longitudinal hinge 113A and the second longitudinal hinge 114A have the same shape as those of the first longitudinal hinge 13A and the second longitudinal hinge 14A according to the first embodiment. The first longitudinal hinge 113A and the second longitudinal hinge 114A, however, are disposed separately in the second direction Dy. Therefore, the first longitudinal hinge 113A and the second longitudinal hinge 114A do not have the intersection 27 (refer to FIG. 7).

The stretchable device LA according to the second embodiment does not have the restriction on the layout of intersecting the first coupling portion 25 and the second coupling portion 26 where the amount of deformation (strain) is small. Thus, the stretchable device 1A can be designed in a simpler manner. In addition, it is unnecessary to provide the insulating layer 40 (refer to FIG. 11) because the stretchable device 1A does not include the intersection 27. The first longitudinal hinge 113A and the second longitudinal hinge 114A according to the second embodiment, however, need to be disposed such that they do not overlap in the second direction Dy. Therefore, the region occupied by the first longitudinal hinge 113A and the second longitudinal hinge 114A in the second direction Dy is larger. Thus, the space between the bodies 111 in the second direction Dy is longer. Consequently, the space between the transistors 31 is also larger, resulting in lower detection definition.

Third Embodiment

Figure 13:
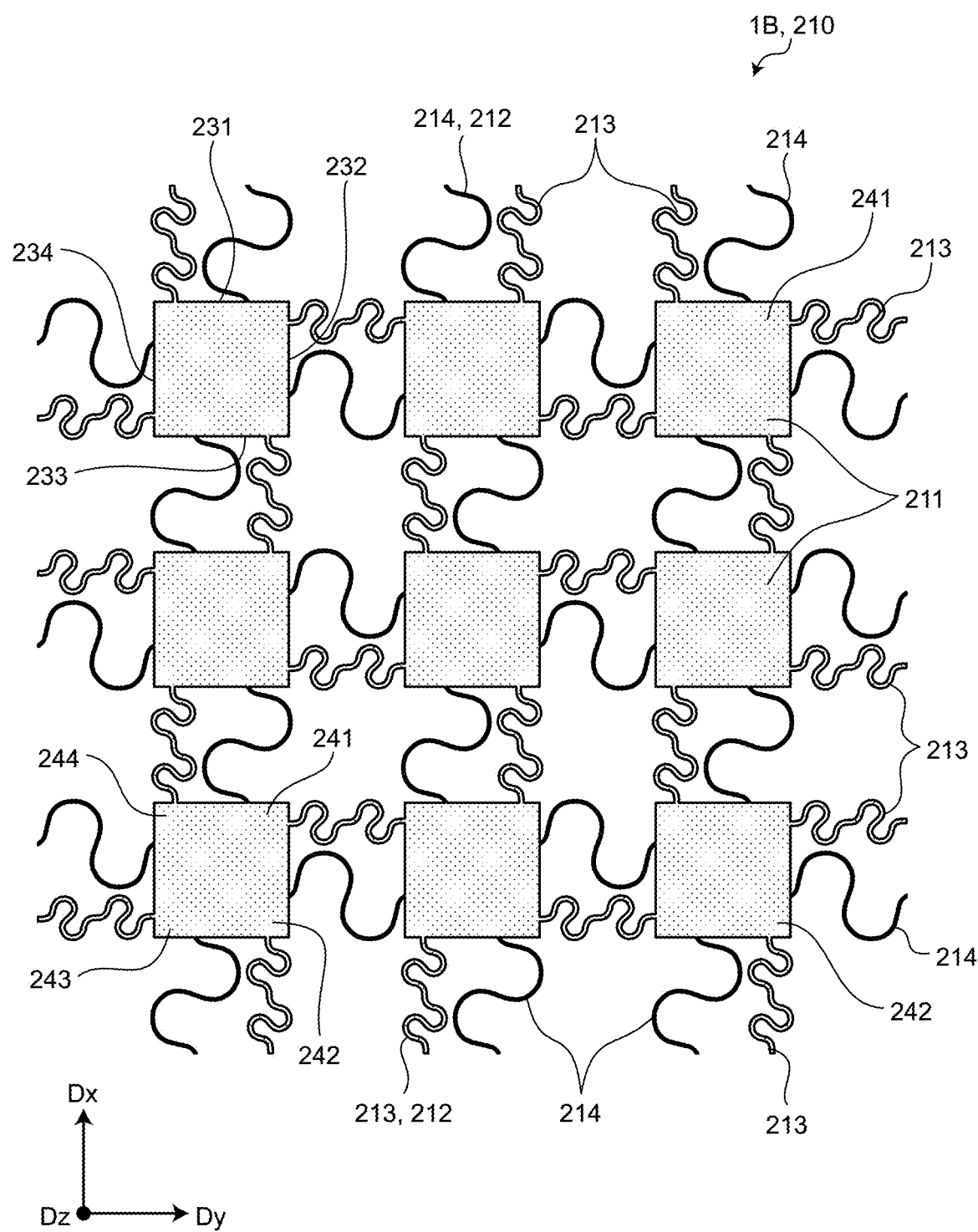
FIG. 13 is a view of the resin base member according to a third embodiment viewed from the second resin plate.

FIG. 13 is a view of the resin base member according to a third embodiment viewed from the second resin plate. A stretchable device 1B according to the third embodiment is different from the stretchable device 1 according to the first embodiment in that it includes a resin base member 210 instead of the resin base member 10. The resin base member 210 includes a plurality of bodies 211 and a plurality of hinges 212. The body 211 has a rectangular shape and is the same as the body 111 described in the second embodiment. The body 211 has four sides 231, 232, 233, and 234 and four corners 241, 242, 243, and 244.

The hinges 212 include a first hinge 213 and a second hinge 214. The first hinge 213 and the second hinge 214 are the same as the first hinge 113 and the second hinge 114 described in the second embodiment. Therefore, the first hinge 213 and the second hinge 214 according to the third embodiment do not intersect. The four sides 231, 232, 233, and 234 are each coupled to one first hinge 213 and one second hinge 214. The first hinge 213 and the second hinge 214 are separated in a direction parallel to the sides 231, 232, 233, and 234 coupled thereto.

The first hinge 213 and the second hinge 214 are disposed as follows. One of the two hinges 212 disposed sandwiching the corner 241, 242, 243, or 244 is the first hinge 213 coupled to one side 231, 232, 233, or 234 of the sides that sandwich the corner 241, 242, 243, or 244. The other is the second hinge 214 coupled to the other side 231, 232, 233, or 234 of the sides that sandwich the corner 241, 242, 243, or 244. In other words, the hinges 212 are disposed such that both of the two hinges 212 that sandwich the corners 241, 242, 243, or 244 are not of the same type: the first hinges 213 or the second hinges 214. Therefore, the coupling positions of the first hinge 213 and the second hinge 214 that are coupled to one of two sides that are in an opposite side relation are arranged alternately with the coupling positions of the first hinge 213 and the second hinge 214 that are coupled to the other of the two sides. In other words, the positions of the first hinge 213 and the second hinge 214 are switched in the direction intersecting the extending direction of the first hinge 213 and the second hinge 214. Of the four sides 231, 232, 233, and 234, the side 231 and the side 233 are in the opposite side relation. The side 232 and the side 234 are also in the opposite side relation. The following describes the advantageous effects.

Figure 14:
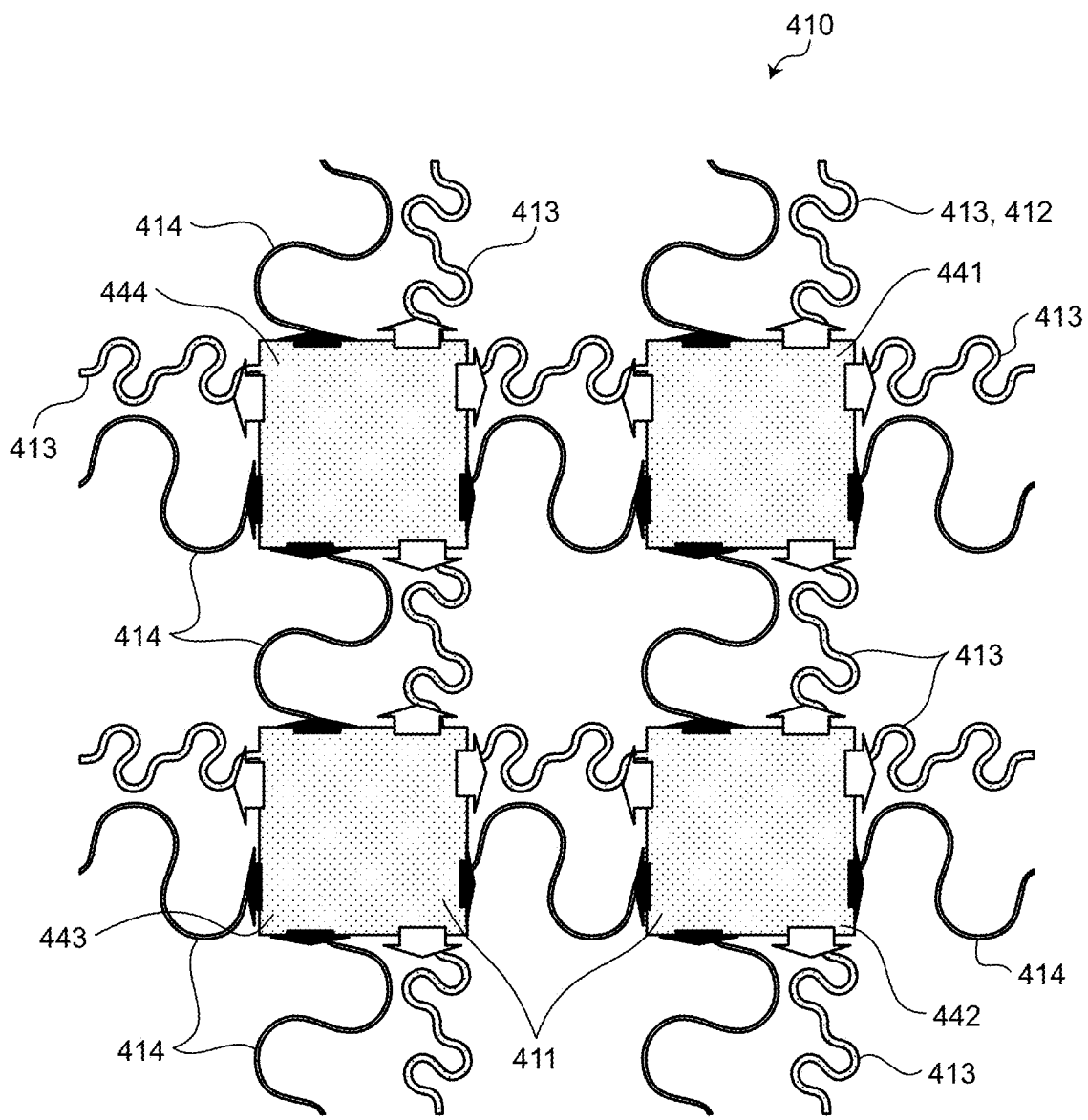
FIG. 14 is a view of the resin base member according to a comparative example viewed from the second resin plate.
Figure 15:
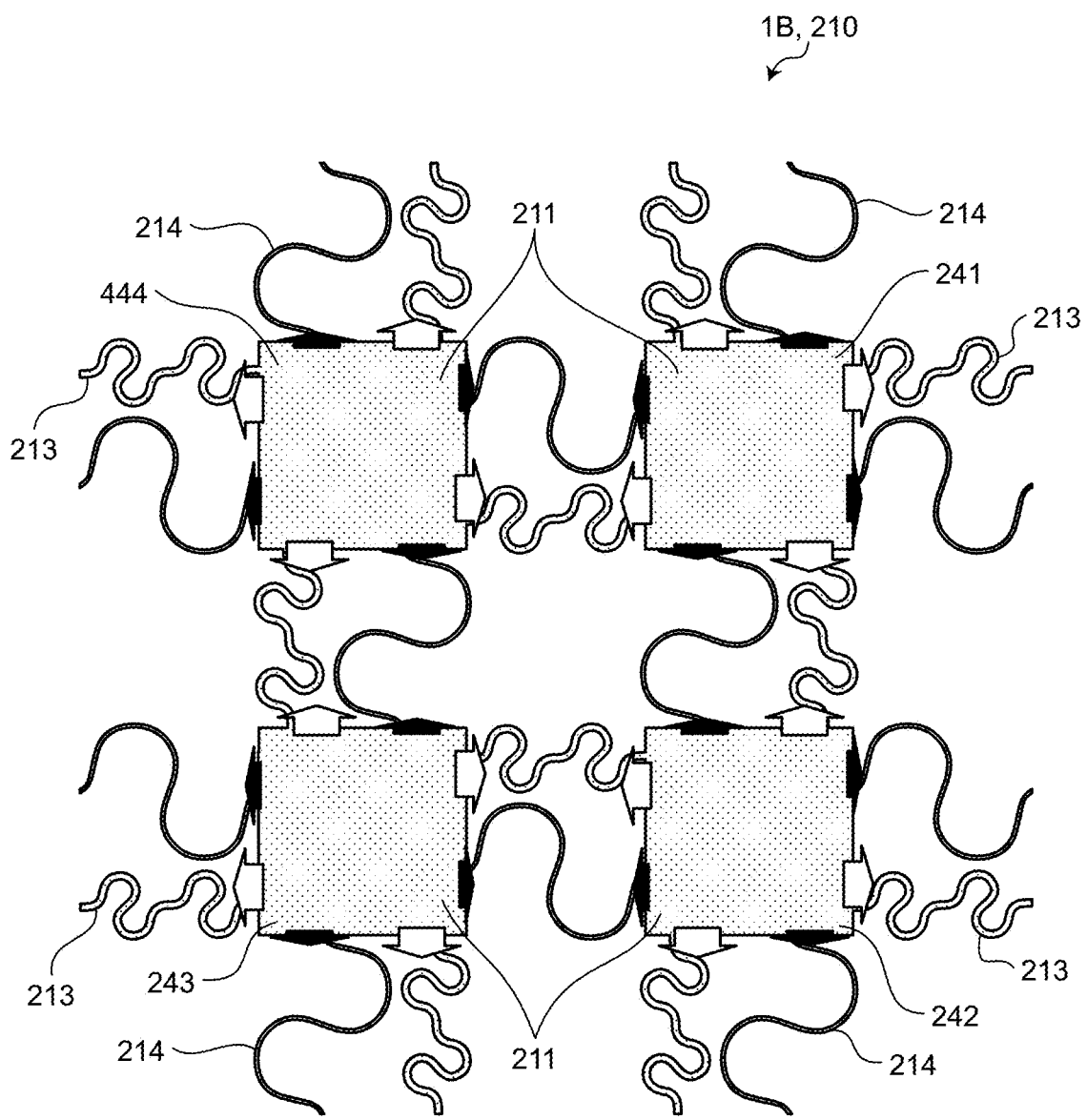
FIG. 15 is a view of the resin base member according to the third embodiment viewed from the second resin plate.

FIG. 14 is a view of the resin base member according to a comparative example viewed from the second resin plate. FIG. 15 is a view of the resin base member according to the third embodiment viewed from the second resin plate. As illustrated in FIG. 14, in a resin base member 410 according to the comparative example, first hinges 413 and second hinges 414 are disposed in a manner linearly arrayed in the first direction Dx and the second direction Dy. According to this comparative example, the hinges 412 that sandwich a corner 441 out of four corners 441, 442, 443, and 444 are both the first hinges 413. The hinges 412 that sandwich the corner 443 out of the four corners 441, 442, 443, and 444 are both the second hinges 414. The hinges 412 that sandwich the corner 442 are the first hinge 413 and the second hinge 414. The hinges 412 that sandwich the corner 444 are the first hinge 413 and the second hinge 414.

When the hinge 412 is extended, the first hinge 413 pulls a body 411 with a larger load than the second hinge 414 (refer to arrows in FIG. 14). Therefore, in the comparative example, the stress acting on the corners 441, 442, 443, and 444 of the body 411 is not uniform when the hinge 412 expands and contracts. In other words, an imbalance is generated in the stress acting on the body 411. Therefore, there are a region on which large stress acts (region where the two first hinges 213 are disposed close to each other) and a region on which small stress acts (region where the two second hinges 214 are disposed close to each other). As a result, the stretchable device may not expand and contract uniformly in the plane.

By contrast, in the configuration according to the third embodiment illustrated in FIG. 15, at each of the four corners 241, 242, 243, and 244, the two hinges 212 that sandwich the corner 241, 242, 243, or 244 are the first hinge 213 and the second hinge 214. The stress acting on the corners 241, 242, 243, and 244 of the body 211 is uniform when the hinge 212 expands and contracts. Therefore, the stretchable device 1B expands and contracts uniformly in the plane. The resin base member of the 5 stretchable device according to the present disclosure may be the resin base member 410 described in the comparative example.

Fourth Embodiment

Figure 16:
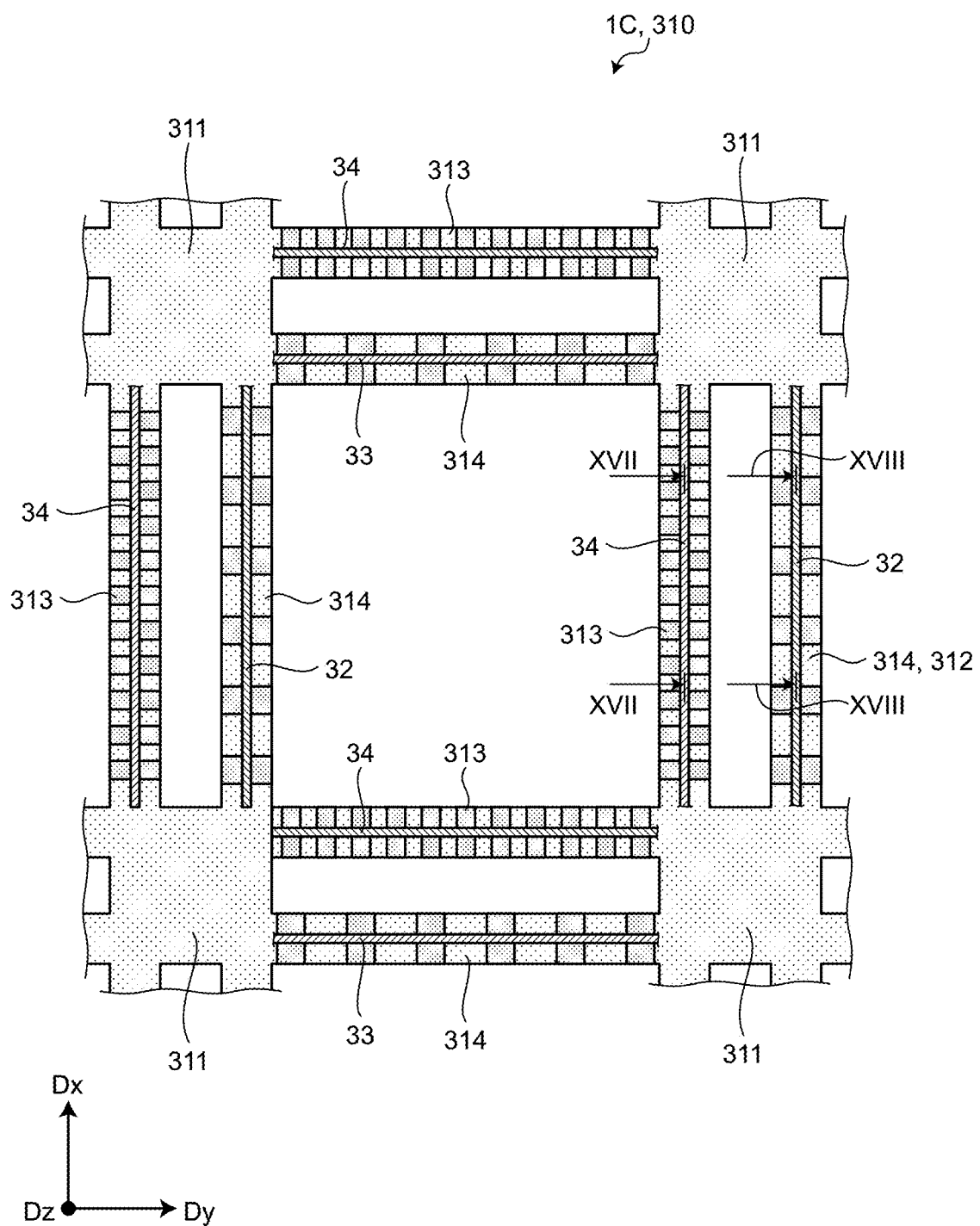
FIG. 16 is a view of the resin base member according to a fourth embodiment viewed from the second resin plate.
Figure 17:
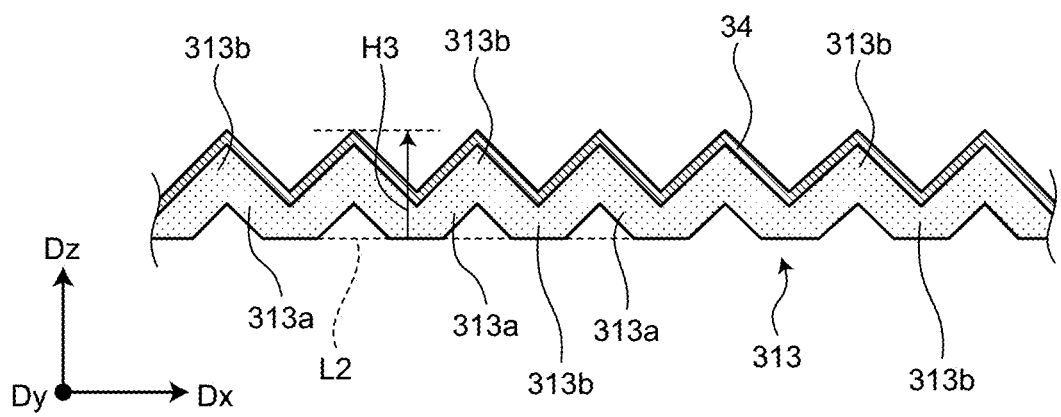
FIG. 17 is a sectional view seen in the arrow direction along line XVII-XVII of FIG. 16.
Figure 18:
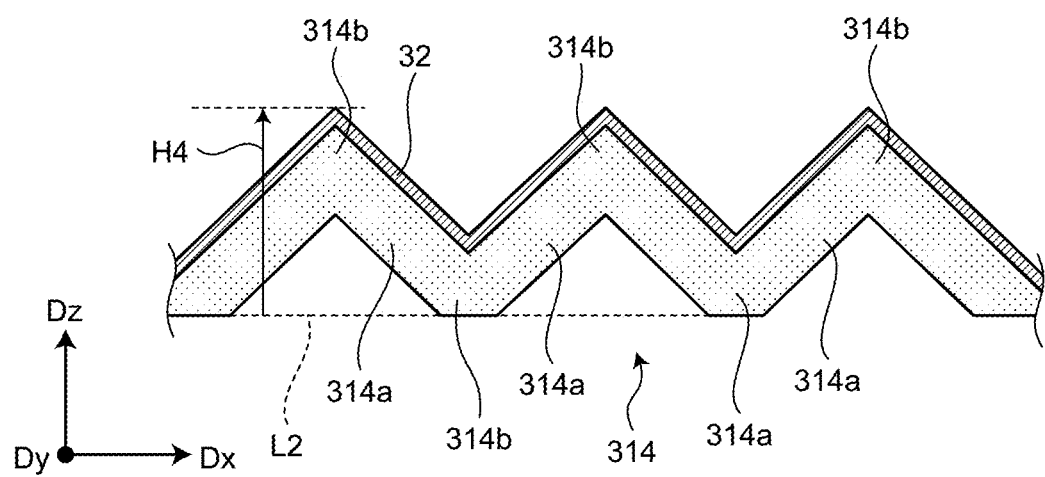
FIG. 18 is a sectional view seen in the arrow direction along line XVIII-XVIII of FIG. 16.

FIG. 16 is a view of the resin base member according to a fourth embodiment viewed from the second resin plate. FIG. 17 is a sectional view seen in the arrow direction along line XVII-XVII of FIG. 16. FIG. 18 is a sectional view seen in the arrow direction along line XVIII-XVIII of FIG. 16.

As illustrated in FIG. 16, a stretchable device 1C according to the fourth embodiment is different from the stretchable device 1 according to the first embodiment in that it includes a resin base member 310 instead of the resin base member 10. The resin base member 310 includes a plurality of bodies 311 and a plurality of hinges 312. The hinges 312 include a first hinge 313 and a second hinge 314. The strain gauge 34 is stacked on the first hinge 313, and the signal line 32, the gate line 33, the first output line (not illustrated in FIG. 16), and the second output line (not illustrated in FIG. 16) are stacked on the second hinge 314.

As illustrated in FIGS. 17 and 18, the first hinge 313 specifically has a plurality of small triangular teeth 313a protruding toward the second resin plate 70 (refer to FIG. 2). The second hinge 314 has a plurality of large triangular teeth 314a protruding toward the second resin plate 70. Therefore, both the first hinge 313 and the second hinge 314 have a triangular wave shape when viewed in the planar direction. As described above, the intersecting direction in which the first hinge 313 and the second hinge 314 according to the present disclosure meander with respect to the imaginary line L2 coupling the adjacent bodies 311 may be the third direction Dz orthogonal to the planar direction.

The first hinge 313 has a plurality of corners 313b that are bent at 90 degrees. The second hinge 314 has a plurality of corners 314b that are bent at 90 degrees. The bending angle of the corners 313b and 314b increases when the first hinge 313 and the second hinge 314 are extended.

A meander length H4 of the large triangular tooth 314a in the intersecting direction is longer than a meander length H3 of the small triangular tooth 313a in the intersecting direction. Thus, the bending angle of the corner 314b of the second hinge 314 is smaller than that of the corner 313b of the first hinge 313. Therefore, the amount of strain in the signal line 32, the gate line (not illustrated in FIG. 18), the first output line (not illustrated in FIG. 18), and the second output line (not illustrated in FIG. 18) stacked on the second hinge 314 is small.

While the embodiments have been described above, the gate line 33 according to the present disclosure may be mounted on the second hinge 14.

What is claimed is:

1. A stretchable device comprising:
   a resin base member; and
   a strain gauge, a signal line, and an output line stacked on the resin base member, wherein
   the resin base member includes:
   a plurality of bodies disposed separately from each other; and
   a plurality of hinges that couple the bodies adjacently disposed while meandering in an intersecting direction intersecting an imaginary line that couples the bodies adjacently disposed,
   the hinges include a first hinge and a second hinge that couple the bodies adjacently disposed,
   a meander length of the second hinge in the intersecting direction is longer than a meander length of the first hinge in the intersecting direction,
   the strain gauge is provided to the first hinge, and
   the signal line and the output line are provided to the second hinge.

2. The stretchable device according to claim 1, wherein
   the bodies are disposed in a matrix having a row-column configuration, and
   the intersecting direction is parallel to a planar direction in which the bodies are arrayed.

3. The stretchable device according to claim 2, wherein
   the first hinge has a first coupling portion having a small amount of deformation when the first hinge expands and contracts,
   the second hinge has a second coupling portion having a small amount of deformation when the second hinge expands and contracts, and
   the first coupling portion and the second coupling portion intersect each other.

4. The stretchable device according to claim 2, wherein
   the first hinge and the second hinge are separated in the planar direction.

5. The stretchable device according to claim 4, wherein
   the bodies each have a rectangular shape with four sides and four corners when viewed in the planar direction,
   the first hinge and the second hinge are provided for each of the four sides and coupled to the side in a manner separated in a direction parallel to the side, and
   two of the hinges disposed sandwiching one of the corners are the first hinge coupled to one of the sides that sandwich the one corner and the second hinge coupled to the other of the sides that sandwich the one corner.

6. The stretchable device according to claim 4, wherein
   the bodies each have a rectangular shape with four sides and four corners when viewed in the planar direction,
   the first hinge and the second hinge are provided for each of the four sides and coupled to the side in a manner separated in a direction parallel to the side, and
   coupling positions of the first hinge and the second hinge that are coupled to one of two sides that are in an opposite side relation are arranged alternately with coupling positions of the first hinge and the second hinge that are coupled to the other of the two sides.

7. The stretchable device according to claim 1, wherein
   the bodies are disposed in a matrix having a row-column configuration, and
   the intersecting direction is orthogonal to a planar direction in which the bodies are arrayed.

8. The stretchable device according to claim 1, comprising a gate line stacked on the second hinge.

9. The stretchable device according to claim 1, wherein
   the resin base member has a first surface facing the strain gauge, the signal line, and the output line, and
   at least one of the strain gauge, the signal line, and the output line is in contact with the first surface.

* * * * *